US010113923B2

(12) United States Patent
Taguchi et al.

(10) Patent No.: US 10,113,923 B2
(45) Date of Patent: Oct. 30, 2018

(54) FORCE DETECTION DEVICE (71) Applicant: DENSO CORPORATION, Kariya, Aichi-pref. (JP)

(72) Inventors: Rie Taguchi, Nagakute (JP); Kentaro Mizuno, Nagakute (JP); Takashi Katsumata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/549,708

(22) PCT Filed: Apr. 8, 2016

(86) PCT No.: PCT/JP2016/001952
§ 371 (c)(1),
(2) Date: Aug. 9, 2017

(87) PCT Pub. No.: WO2016/170748
PCT Pub. Date: Oct. 27, 2016

(65) Prior Publication Data
US 2018/0045587 A1    Feb. 15, 2018

(30) Foreign Application Priority Data

Apr. 22, 2015  (JP) .................................. 2015-87324

(51) Int. Cl.
*G01L 1/18*   (2006.01)
*G01L 9/04*   (2006.01)
*H01L 29/84*  (2006.01)

(52) U.S. Cl.
CPC .................. *G01L 1/18* (2013.01); *G01L 9/04* (2013.01); *H01L 29/84* (2013.01)

(58) Field of Classification Search
CPC .............. G01L 1/18; G01L 9/04; H01L 29/84
See application file for complete search history.

(56) References Cited

U.S. PATENT DOCUMENTS 5,773,728 A * 6/1998 Tsukada ................... G01L 1/18
                                                    338/5
9,010,193 B2 * 4/2015 Walther ............. G01C 19/5712
                                                    73/774

(Continued)

FOREIGN PATENT DOCUMENTS

JP   2001-304997 A   10/2001
JP   2002-257645 A    9/2002

(Continued)

*Primary Examiner* — Francis C Gray
(74) *Attorney, Agent, or Firm* — Posz Law Group, PLC (57) ABSTRACT

A force detection device includes: a substrate that includes a power supply wire, a reference wire, a first output wire, a second output wire and first to fourth mesa gauges extending along a first direction; and a force transmission block connected to the substrate. A pair of the first and second mesa gauges and a pair of the third and fourth mesa gauges are connected in parallel to each other between the power supply wire and the reference wire. The first output wire is connected between the first and second mesa gauges. The second output wire is connected between the third and fourth mesa gauges. A contact area of the force transmission block with a first pair of the first and fourth mesa gauges is different from a contact area of the force transmission block with a second pair of the second and third mesa gauges.

6 Claims, 5 Drawing Sheets

(56) References Cited

U.S. PATENT DOCUMENTS

| | | | | |
|---|---|---|---|---|
| 2011/0080069 | A1* | 4/2011 | Cueff | H01L 41/094 |
| | | | | 310/328 |
| 2017/0102274 | A1* | 4/2017 | Mizuno | G01L 1/18 |
| 2018/0024014 | A1* | 1/2018 | Taguchi | G01L 9/00 |
| | | | | 73/862.628 |

FOREIGN PATENT DOCUMENTS

| | | |
|---|---|---|
| JP | 2004-132811 A | 4/2004 |
| WO | 2016/163111 A1 | 10/2016 |

* cited by examiner

FORCE DETECTION DEVICE

CROSS REFERENCE TO RELATED APPLICATIONS

This application is a U.S. national stage application of International Patent Application No. PCT/JP2016/001952 filed on Apr. 8, 2016 and is based on Japanese Patent Application No. 2015-87324 filed on Apr. 22, 2015, the disclosure of which is incorporated herein by reference.

TECHNICAL FIELD

The present disclosure relates to a force detection device that utilizes a piezo-resistive effect.

BACKGROUND ART

A force detection device utilizing a piezoresistive effect has been developed, and an example of the force detection device is disclosed in Patent Literature 1. The force detection device of this type includes a substrate and a force transmission block. A main surface of the substrate is provided with multiple mesa gauges that form a bridge circuit. For example, multiple mesa gauges forming the bridge circuit are arranged corresponding to rectangular sides. The force transmission block is disposed so as to come in contact with top faces of the multiple mesa gauges. When the force transmission block presses the mesa gauges, a compressive stress to be applied to the mesa gauges increases, and electric resistance values of the mesa gauges change due to the piezoresistive effect. A force to be applied to the force transmission block is detected based on the change in the electric resistance value.

PATENT LITERATURE

Patent Literature 1: JP-2001-304997-A

SUMMARY

It is an object of the present disclosure to provide a force detection device in which an offset voltage is reduced.

According to an aspect of the present disclosure, a force detection device includes: a substrate that includes a power supply wire, a reference wire, a first output wire, a second output wire and a plurality of mesa gauges disposed on a main surface of the substrate; and a force transmission block that is connected to the substrate. The plurality of mesa gauges include a first mesa gauge, a second mesa gauge, a third mesa gauge, and a fourth mesa gauge. The first mesa gauge and the second mesa gauge are connected in series with each other between the power supply wire and the reference wire, the first mesa gauge is connected to a power supply wire side, and the second mesa gauge is connected to a reference wire side. The third mesa gauge and the fourth mesa gauge are connected in series with each other between the power wire and the reference wire, the third mesa gauge is connected to the power supply wire side, and the fourth mesa gauge is connected to the reference wire side. A pair of the first mesa gauge and the second mesa gauge and a pair of the third mesa gauge and the fourth mesa gauge are connected in parallel to each other between the power supply wire and the reference wire. The first output wire is connected between the first mesa gauge and the second mesa gauge. The second output wire is connected between the third mesa gauge and the fourth mesa gauge. Each of the first mesa gauge, the second mesa gauge, the third mesa gauge, and the fourth mesa gauge extends along a first direction. A contact area of the force transmission block with respect to a first pair of the first mesa gauge and the fourth mesa gauge is different from a contact area of the force transmission block with respect to a second pair of the second mesa gauge and the third mesa gauge.

In the above force detection device, since all of the multiple mesa gauges forming the bridge circuit extend along the first direction, crystal directions of the mesa gauges are identical with each other. For that reason, the respective resistance values of the multiple mesa gauges become equal to each other, and an offset voltage is reduced.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

In a force detection device that utilizes a piezoresistive effect, it is desired to reduce an offset voltage. In order to reduce the offset voltage, when no compressive stress is applied to mesa gauges, there is a need to equalize the respective resistance values of the multiple mesa gauges forming a bridge circuit. Normally, in the force detection device of this type, taking symmetry into consideration, the respective widths and lengths of the multiple mesa gauges are commonly shaped. For that reason, the respective resistance values of the multiple mesa gauges have been considered to coincide with each other. However, as a result of examination by the present inventors, it has been found that even if the multiple mesa gauges are commonly shaped, the respective resistance values of the multiple mesa gauges do not coincide with each other. This is considered to be because crystal directions are different from each other in the multiple mesa gauges forming the bridge circuit. The present specification aims at providing a force detection device with a reduced offset voltage.

Hereinafter, features of a technology disclosed in the present specification will be summarized. Incidentally, each of the following items has technical usefulness, independently.

The force detection device according to an embodiment disclosed in the present specification is directed to a sensor that detects various pressures, and in one example, air pressure or liquid pressure may be detected. The force detection device may include a substrate and a force transmission block. It is desirable that a material of the substrate exhibits a piezoresistive effect in which an electric resistance varies according to a compressive stress. For example, a semiconductor substrate and an SOI substrate are exemplified as the substrate. A power supply wire, a reference wire, a first output wire, a second output wire, and multiple mesa gauges are disposed on a main surface of the substrate. The power supply wire, the reference wire, the first output wire, and the second output wire may be formed by a part of the main surface of the substrate, or may be arranged on the main surface of the substrate. A force transmission block is joined to the substrate. The multiple mesa gauges include a first mesa gauge, a second mesa gauge, a third mesa gauge, and a fourth mesa gauge. The first mesa gauge and the second mesa gauge are connected in series with each other between the power supply wire and the reference wire. The first mesa gauge is connected to the power supply wire side, and the second mesa gauge is connected to the reference wire side. The third mesa gauge and the fourth mesa gauge are connected in series with each other between the power supply wire and the reference wire. The third mesa gauge is connected to the power supply wire side, and the fourth mesa gauge is connected to the reference wire side. A pair of the first mesa gauge and the second mesa gauge and a pair of the third mesa gauge and the fourth mesa gauge are connected in parallel to each other between the power supply wire and the reference wire. The first output wire is connected between the first mesa gauge and the second mesa gauge. The second output wire is connected between the third mesa gauge and the fourth mesa gauge. All of the first mesa gauge, the second mesa gauge, the third mesa gauge, and the fourth mesa gauge extend along a first direction. A contact area of the force transmission block to a first pair of the first mesa gauge and the fourth mesa gauge is different from a contact area of the force transmission block to a second pair of the second mesa gauge and the third mesa gauge. In the force detection device according to the above embodiment, since all of the four mesa gauges extend along the same direction, the electric resistance values of the four mesa gauges change in the same manner according to a stress. The contact area of the force transmission block to the first pair of the first mesa gauge and the fourth mesa gauge is different from the contact area of the force transmission block to the second pair of the second mesa gauge and the third mesa gauge. Therefore, the bridge circuit configured by those mesa gauges can change the output according to the force applied to the force transmission block.

The force transmission block may come in contact with any one pair of the first pair of the first mesa gauge and the fourth mesa gauge and the second pair of the second mesa gauge and the third mesa gauge, and may come out of contact with the other pair. In the force transmission device, a force is transmitted to only the mesa gauges of any one of the first pair and the second pair through the force transmission block, and the mesa gauges of the one pair function as a variable resistive element of the bridge circuit, and the mesa gauges of the other pair function as a fixed resistive element of the bridge circuit. The force transmission device can have a high sensitive characteristic.

The substrate may have a sealing portion that extends around a detection unit where the multiple mesa gauges are disposed and is joined to the force transmission block. In this case, a positional relationship of one of the mesa gauges in one of the pairs which is relatively large in a contact area with the force transmission block to the sealing portion is equal to a positional relationship of the other mesa gauge included in the one pair relatively large in the contact area with the force transmission block to the sealing portion, in a second direction orthogonal to the first direction. In the force detection device, the force transmitted to each of the mesa gauges included in the pair having a relatively large contact area with the force transmission block is equal to each other, and the linearity of the output to the force is improved.

The respective mesa gauges included in one of the pairs relatively large in the contact area with the force transmission block may be disposed side by side in the second direction across a center point of a region surrounded by the sealing portion.

The first mesa gauge, the second mesa gauge, the third mesa gauge, and the fourth mesa gauge may be disposed to correspond to rectangular corners. In this case, the first mesa gauge and the fourth mesa gauge are disposed diagonally, and the second mesa gauge and the third mesa gauge are arranged diagonally.

The respective mesa gauges included in one of the pairs relatively large in the contact area with the force transmission block may be disposed side by side in the first direction across a center point of the region surrounded by the sealing portion.

First Embodiment

Figure 1:
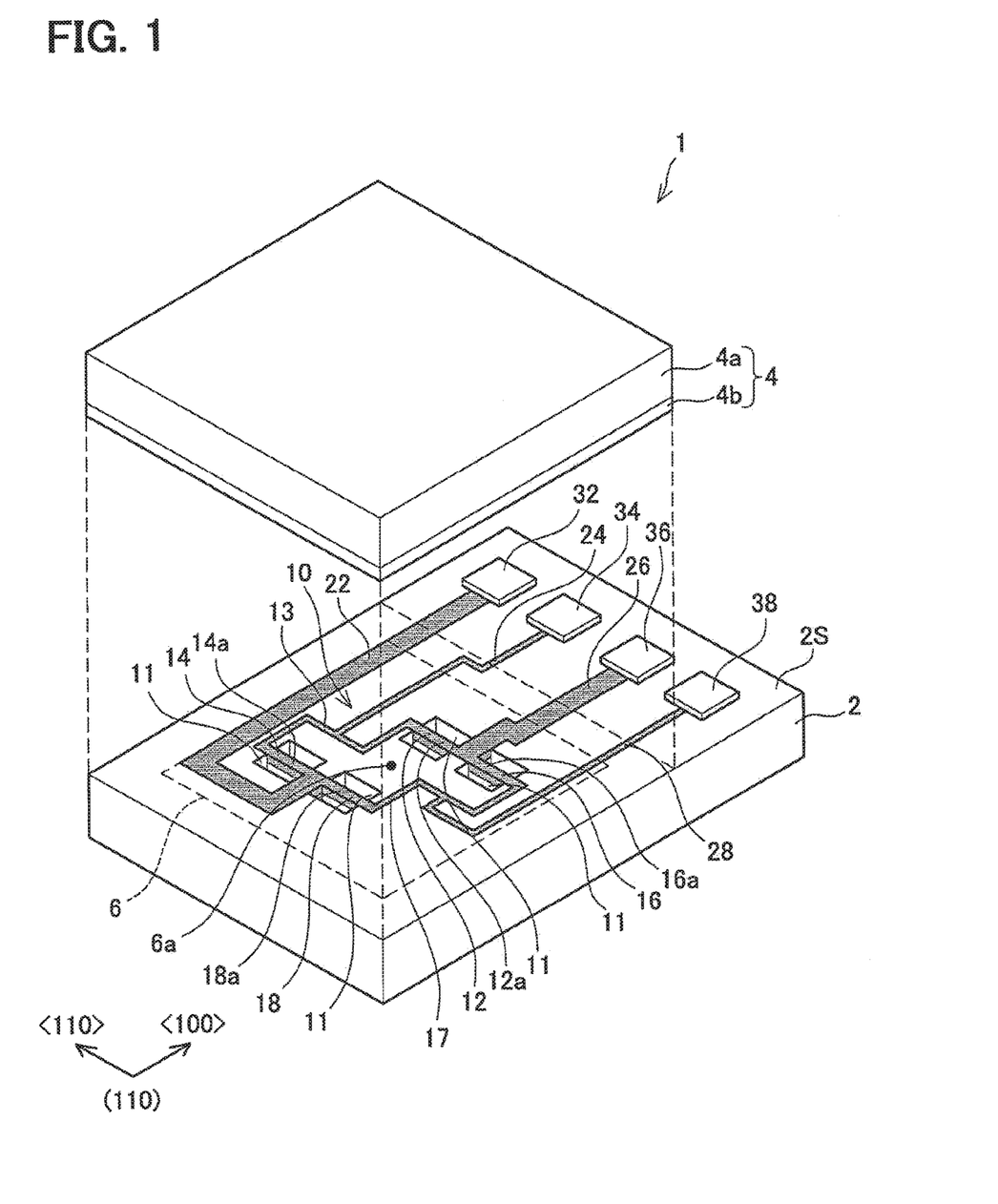
FIG. 1 schematically illustrates an exploded perspective view of a force detection device according to an embodiment in which an edge at which a semiconductor substrate and a force transmission block are joined to each other is indicated by a broken line, and an area of a sealed space configured by the semiconductor substrate and the force transmission block is indicated by a broken line, FIG. 2 schematically illustrates a top view of a semiconductor substrate provided in the force detection device according to the embodiment in which an edge at which a semiconductor substrate and a force transmission block are joined to each other is indicated by a broken line, and an area of a sealed space configured by the semiconductor substrate and the force transmission block is indicated by a broken line, FIG. 3 schematically illustrates a cross-sectional view taken along a line III-III in FIG. 2.

As illustrated in FIG. 1, the force detection device 1 is, for example, a semiconductor pressure sensor that detects an internal pressure of a pressure vessel, and includes a semiconductor substrate 2 and a force transmission block 4.

Figure 2:
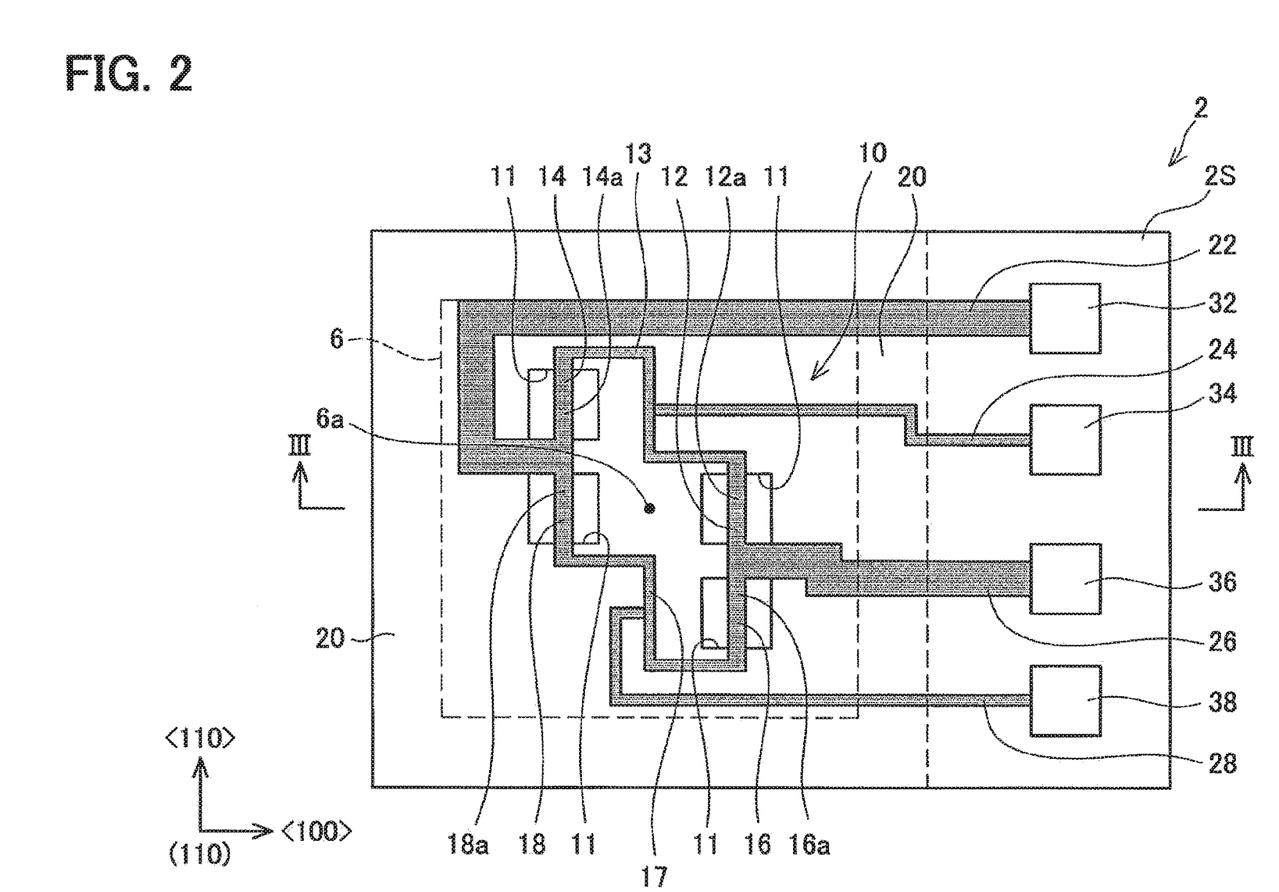

As illustrated in FIGS. 1 and 2, the semiconductor substrate 2 is made of n-type single crystal silicon, and a main surface 2S of the semiconductor substrate 2 is a (110) crystal plane. Multiple grooves 11 are provided in the main surface 2S of the semiconductor substrate 2. The multiple grooves 11 are provided in a detection unit 10 of the main surface 2S of the semiconductor substrate 2, and define multiple mesa gauges 12, 14, 16, and 18 in the detection unit 10.

Figure 3:
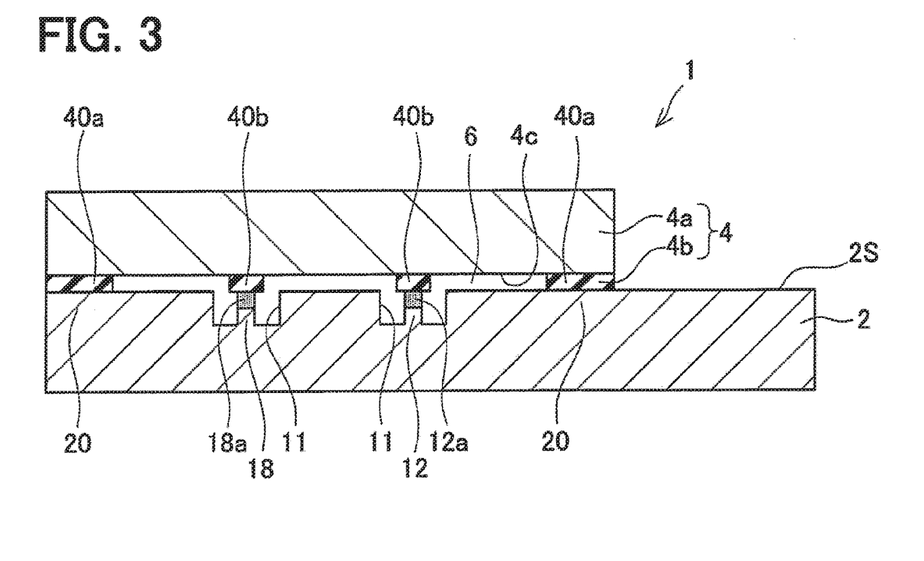

As illustrated in FIGS. 1, 2 and 3, the mesa gauges 12, 14, 16, and 18 protrude in a mesa shape from bottom surfaces of the grooves 11, and heights of the mesa gauges are set to about 0.5 to 5 μm. Top faces of the mesa gauges 12, 14, 16, and 18 are located to be flush with the main surface 2S of the semiconductor substrate 2 around the grooves 11. In other words, the mesa gauges 12, 14, 16, and 18 are formed as the remainder obtained by providing the multiple grooves 11 in the main surface 2S of the semiconductor substrate 2 by leveraging, for example, a dry etching technology.

As illustrated in FIGS. 1 and 2, all of the mesa gauges 12, 14, 16, and 18 of the detection unit 10 extend along a <110> direction of the semiconductor substrate 2. The mesa gauges 12, 14, 16, and 18 extending in the <110> direction of the semiconductor substrate 2 are characterized by the electric resistance value greatly changing according to the compressive stress, and have the piezoresistive effect. Also, the mesa gauges 12, 14, 16, and 18 have the same width and length. The widths of the mesa gauges 12, 14, 16, and 18 are widths in a direction orthogonal to a longitudinal direction, and in this example, the widths are widths in the <100> direction of the semiconductor substrate 2.

As illustrated in FIGS. 1, 2 and 3, gauge portions 12a, 14a, 16a, and 18a into which p-type impurities are implanted are formed on surfaces of the mesa gauges 12, 14, 16, and 18. Impurity concentrations of the gauge portions 12a, 14a, 16a, and 18a are about $1\times10^{18}$ to $1\times10^{21}$ cm$^{-3}$. Impurity concentrations and diffusion depths of the gauge portions 12a, 14a, 16a, and 18a are common to the respective mesa gauges 12, 14, 16, and 18. The gauge portions 12a, 14a, 16a, and 18a are substantially insulated from the n-type semiconductor substrate 2 by a pn junction.

As illustrated in FIGS. 1 and 2, the semiconductor substrate 2 has wires 13, 17, 22, 24, 26, and 28 into which p-type impurities are implanted on the main surface 2S. The impurity concentrations of the wires 13, 17, 22, 24, 26, and 28 are about $1\times10^{18}$ to $1\times10^{21}$ cm$^{-3}$. The wirings 13, 17, 22, 24, 26, and 28 are formed in the same process as that of the gauge portions 12a, 14a, 16a, and 18a of the mesa gauges 12, 14, 16, and 18.

The mesa gauges 12, 14, 16, and 18 form a full bridge circuit in the detection unit 10. The gauge portion 12a of the first mesa gauge 12 and the gauge portion 14a of the second mesa gauge 14 are connected in series with each other between the power supply wire 26 and the reference wire 22. The gauge portion 16a of the third mesa gauge 16 and the gauge portion 18a of the fourth mesa gauge 18 are connected in series with each other between the power supply wire 26 and the reference wire 22. A pair of the gauge portion 12a of the first mesa gauge 12 and the gauge portion 14a of the second mesa gauge 14 is connected in parallel to a pair of the gauge portion 16a of the third mesa gauge 16 and the gauge portion 18a of the fourth mesa gauge 18 between the power supply wire 26 and the reference wire 22.

The first output wire 24 is connected to the first connection wire 13 between the gauge portion 12a of the first mesa gauge 12 and the gauge portion 14a of the second mesa gauge 14. The second output wire 28 is connected to the second connection wire 17 between the gauge portion 16a of the third mesa gauge 16 and the gauge portion 18a of the fourth mesa gauge 18.

The reference wire 22 is electrically connected to the reference electrode 32. The first output wire 24 is electrically connected to the first output electrode 34. The power supply wire 26 is electrically connected to the power supply electrode 36. The second output wire 28 is electrically connected to the second output electrode 38. Those electrodes 32, 34, 36, and 38 are provided on the main surface 2S of the semiconductor substrate 2, and are arranged outside of an area covered by the force transmission block 4. The reference wire 22 and the power supply wire 26 are configured to be wider and resistance values of the reference wire 22 and the power supply wire 26 are negligibly small as compared with the resistance values of the gauge portions 12a, 14a, 16a, and 18a of the mesa gauges 12, 14, 16, and 18. The resistance value of the first output wire 24 and the resistance value of the second output wire 28 are set to be equal to each other.

As illustrated in FIGS. 1 and 3, the force transmission block 4 has a rectangular parallelepiped shape, and includes a silicon layer 4a and a silicon oxide layer 4b. The semiconductor substrate 2 and the force transmission block 4 are joined to each other by leveraging a room temperature single phase joining technique. Specifically, after activating the main surface 2S of the semiconductor substrate 2 and a surface of the silicon oxide layer 4b of the force transmission block 4 have been activated with the use of argon ions, the main surface 2S of the semiconductor substrate 2 and the surface of the silicon oxide layer 4b of the force transmission block 4 are brought into contact with each other to join those components to each other.

Figure 4:
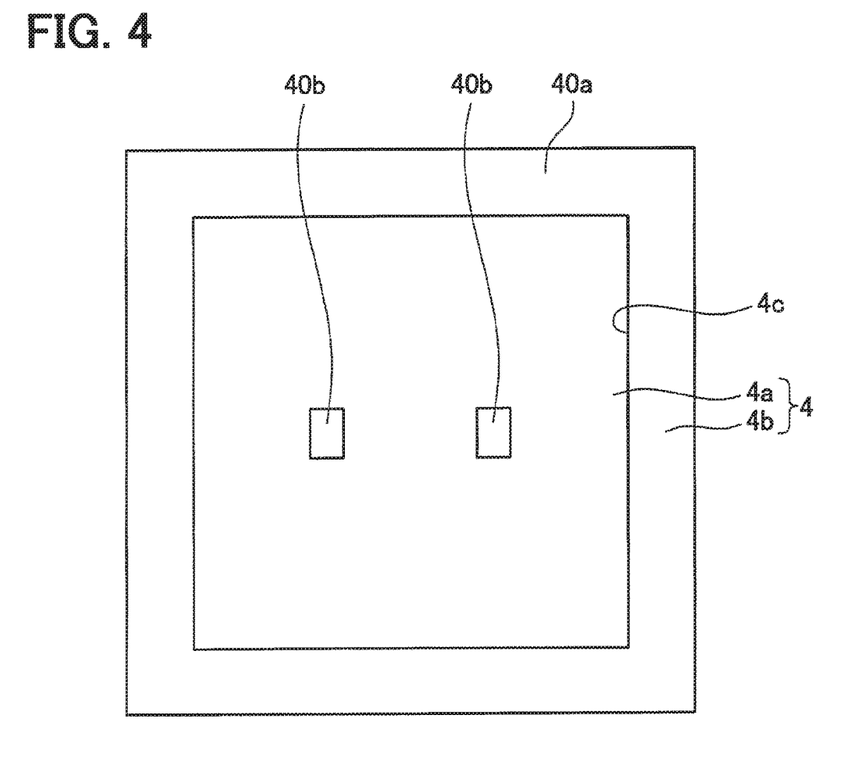
FIG. 4 is a diagram illustrating a force transmission block provided in the force detection device according to the embodiment, and schematically illustrating a surface of the force transmission block joined to the semiconductor substrate, FIG. 5 schematically illustrates a top view of a semiconductor substrate provided in the force detection device according to a modification in which an edge at which a semiconductor substrate and a force transmission block are joined to each other is indicated by a broken line, and an area of a sealed space configured by the semiconductor substrate and the force transmission block is indicated by a broken line, and FIG. 6 schematically illustrates a top view of a semiconductor substrate provided in the force detection device according to a modification in which an edge at which a semiconductor substrate and a force transmission block are joined to each other is indicated by a broken line, and an area of a sealed space configured by the semiconductor substrate and the force transmission block is indicated by a broken line.

As illustrated in FIGS. 3 and 4, a part of the silicon oxide layer 4b of the force transmission block 4 is removed, and a groove 4c is provided in the surface of the force transmission block 4 on a side of the force transmission block 4 joined to the semiconductor substrate 2. With the provision of the groove 4c, the silicon oxide layer 4b of the force transmission block 4 is partitioned into a sealing portion 40a and a pressing portion 40b. In addition, with the provision of the groove 4c, a sealed space 6 separated from the outside is defined between the semiconductor substrate 2 and the force transmission block 4.

The sealing portion 40a of the force transmission block 4 is joined to the main surface 2S of the semiconductor substrate 2 so as to extend around the mesa gauges 12, 14, 16, and 18. A portion of the semiconductor substrate 2 to which the sealing portion 40a of the force transmission block 4 is joined is referred to as a sealing portion 20. Since the sealing portion 40a of the force transmission block 4 is formed in a rectangular shape, the sealing portion 20 of the semiconductor substrate 2 is configured by a portion parallel to the longitudinal direction of the mesa gauges 12, 14, 16, and 18 and a portion orthogonal to the longitudinal direction of the mesa gauges 12, 14, 16, and 18. The sealing portion 20 of the semiconductor substrate 2 and the sealing portion 40a of the force transmission block 4 are hermetically joined to each other.

The pressing portion 40b of the force transmission block 4 is selectively joined to any top surface of the first mesa gauge 12 and the fourth mesa gauge 18, and is not joined to top faces of the second mesa gauge 14 and the third mesa gauge 16. A contact area where the pressing portion 40b of the force transmission block 4 comes in contact with the first mesa gauge 12 is equal to an area where the pressing portion 40b of the force transmission block 4 comes in contact with the fourth mesa gauge 18.

Next, the operation of the force detection device 1 will be described. First, in the force detection device 1, a constant current source is connected to the power supply electrode 36, the reference electrode 32 is grounded, and a voltage measuring device is connected between the first output electrode 34 and the second output electrode 38. In the force detection device 1, when an internal pressure of the vessel to be applied to the force transmission block 4 is changed, a compressive stress to be applied to the gauge portion 12a of the first mesa gauge 12 and the gauge portion 18a of the fourth mesa gauge 18 through the force transmission block 4 also changes. Since the piezoresistive effect appears in the gauge portion 12a of the first mesa gauge 12 and the gauge portion 18a of the fourth mesa gauge 18, the electric resistance values of the gauge portions 12a and 18a change in proportion to the compressive stress. On the other hand, since no compressive stress is applied to the gauge portion 14a of the second mesa gauge 14 and the gauge portion 16a of the third mesa gauge 16, the electric resistance values of the gauge portions 14a and 16a do not change. For that reason, a potential difference between the first output electrode 34 and the second output electrode 38 is proportional to the compressive stress to be applied to the gauge portion 12a of the first mesa gauge 12 and the gauge portion 18a of the fourth mesa gauge 18. As a result, the internal pressure of the vessel applied to the force transmission block 4 is detected according to the voltage change measured by the voltage measuring device.

In the force detection device 1, all of the mesa gauges 12, 14, 16, and 18 extend along the <110> direction of the semiconductor substrate 2. For that reason, since all of the four mesa gauges 12, 14, 16, and 18 forming the bridge circuit extend along the same direction, the crystal directions of the four mesa gauges 12, 14, 16, and 18 are identical with each other. Since the widths and lengths of the four mesa gauges 12, 14, 16, and 18 are the same as each other, the respective resistance values of the four mesa gauges 12, 14, 16, and 18 when no compressive stress is applied to those mesa gauges extremely excellently coincide with each other. As a result, in the force detection device 1, the offset voltage is reduced.

The force detection device 1 has a sealed type structure in which the detection unit 10 of the semiconductor substrate 2 is sealed by the force transmission block 4. In such a force detection device 1, the compressive stresses to be applied to the first mesa gauge 12 and the fourth mesa gauge 18 depend on the positions of the first mesa gauge 12 and the fourth mesa gauge 18 in the sealed space 6. In this example, as illustrated in FIG. 2, since the first mesa gauge 12 and the fourth mesa gauge 18 extend along the <110> direction of the semiconductor substrate 2, the compressive stresses to be applied to the first mesa gauge 12 and the fourth mesa gauge 18 depend on the positions of the first mesa gauge 12 and the fourth mesa gauge 18 in the sealed space 6 in the <100> direction of the semiconductor substrate 2.

In the force detection device 1, in the <100> direction of the semiconductor substrate 2, a shortest distance between the first mesa gauge 12 and the sealing portion 20 of the semiconductor substrate 2 (a portion of the sealing portion 20 parallel to the longitudinal direction of the first mesa gauge 12, and corresponding to an edge of the sealed space 6 on a right side of a paper surface of FIG. 2) is equal to a shortest distance between the fourth mesa gauge 18 and the sealing portion 20 of the semiconductor substrate 2 (a portion of the sealing portion 20 parallel to the longitudinal direction of the fourth mesa gauge 18, and corresponding to an edge of the sealed space 6 on a left side of the paper surface of FIG. 2). Further, in the force detection device 1, in the <100> direction of the semiconductor substrate 2, a shortest distance between the first mesa gauge 12 and the sealing portion 20 of the semiconductor substrate 2 (a portion of the sealing portion 20 parallel to the longitudinal direction of the first mesa gauge 12, and corresponding to an edge of the sealed space 6 on the left side of a paper surface of FIG. 2) is equal to a shortest distance between the fourth mesa gauge 18 and the sealing portion 20 of the semiconductor substrate 2 (a portion of the sealing portion 20 parallel to the longitudinal direction of the fourth mesa gauge 18, and corresponding to an edge of the sealed space 6 on the right side of the paper surface of FIG. 2). In other words, in the force detection device 1, the positional relationship of the first mesa gauge 12 to the sealing portion 20 and the positional relationship of the fourth mesa gauge 18 to the sealing portion 20 are equal to each other in the <100> direction of the semiconductor substrate 2. As a result, since the force transmitted to each of the first mesa gauge 12 and the fourth mesa gauge 18 becomes equal to the force applied to the force transmission block 4, the linearity of the output to the force applied to the force transmission block 4 is improved. In addition, if the first mesa gauge 12 and the fourth mesa gauge 18 are disposed in a positional relationship in which the sealed space 6 is equally divided in three pieces in the <100> direction of the semiconductor substrate 2, the linearity of the output to the force applied to the force transmission block 4 is further improved.

Furthermore, in the force detection device 1, the first mesa gauge 12 and the fourth mesa gauge 18 are disposed side by side in the <100> direction of the semiconductor substrate 2 across a center point 6a of the sealed space 6. The first mesa gauge 12 and the fourth mesa gauge 18 are disposed symmetrically with respect to the center point 6a of the sealed space 6. For that reason, since the force to be applied to the force transmission block 4 is equally transmitted to each of the top faces of the first mesa gauge 12 and the fourth mesa gauge 18, the linearity of the output to the force applied to the force transmission block 4 is further improved.

Furthermore, in the detection unit 10 of the force detection device 1, the multiple mesa gauges 12, 14, 16, 18 and the connection wires 13, 17 are arranged symmetrically with respect to the center point 6a of the sealed space 6. As a result, since the resistance values of the respective resistive elements constituting the bridge circuit become equal to each other, an offset voltage of the force detection device 1 is further reduced.

The layout of the multiple mesa gauges 12, 14, 16, and 18 described above may be replaced with the following layout. In the following description, common components are denoted by common reference numerals, and a description of the common components will be omitted.

Figure 5:
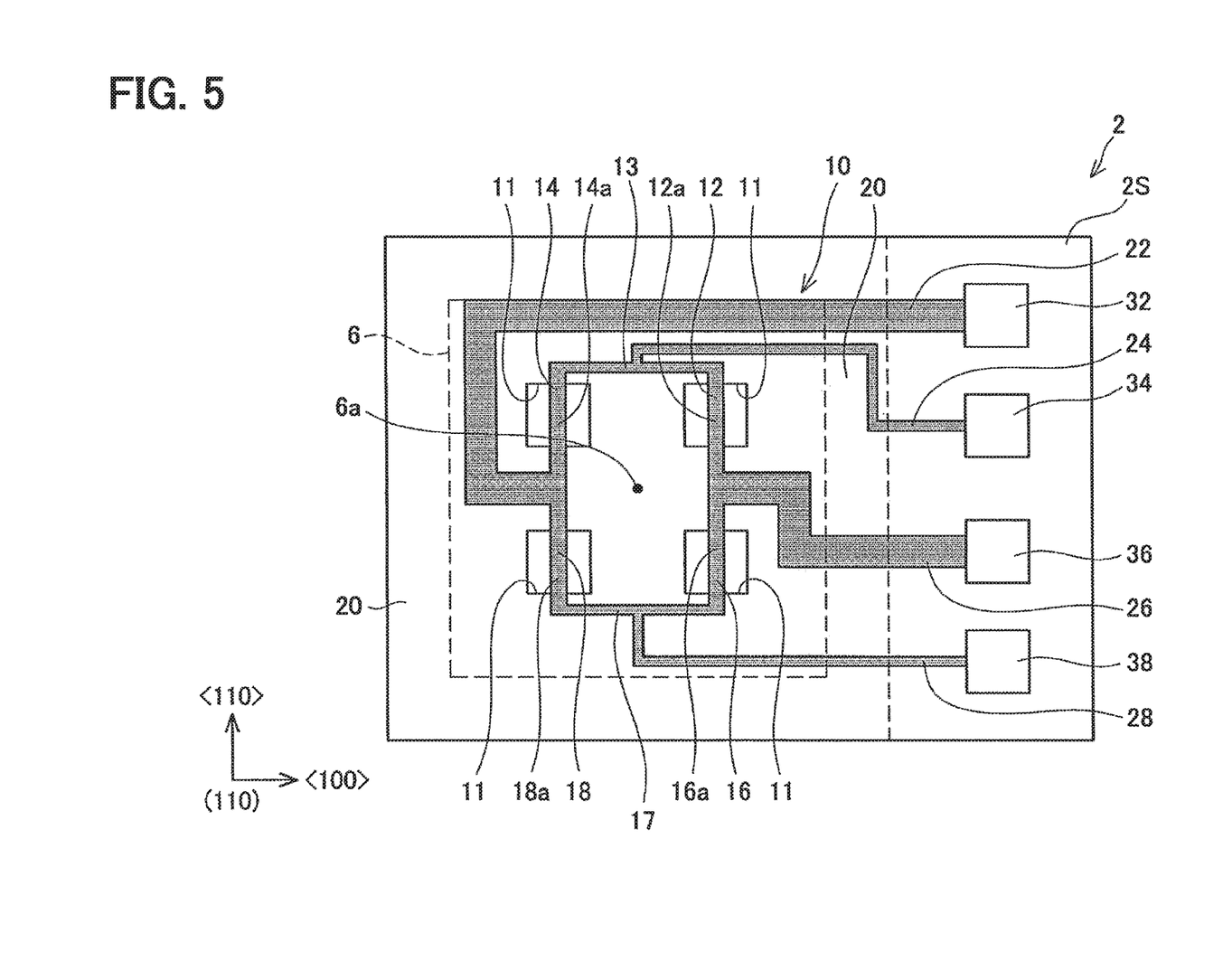

In the example illustrated in FIG. 5, the first mesa gauge 12, the second mesa gauge 14, the third mesa gauge 16, and the fourth mesa gauge 18 are disposed to correspond to rectangular corners. The first mesa gauge 12 and the fourth mesa gauge 18 are disposed diagonally. The second mesa gauge 14 and the third mesa gauge 16 are disposed diagonally. The force transmission block 4 is selectively joined to any top surface of the first mesa gauge 12 and the fourth mesa gauge 18, and is not joined to top faces of the second mesa gauge 14 and the third mesa gauge 16.

Similarly, in this example, in the <100> direction of the semiconductor substrate 2, a shortest distance between the first mesa gauge 12 and the sealing portion 20 of the semiconductor substrate 2 (a portion of the sealing portion 20 parallel to the longitudinal direction of the first mesa gauge 12, and corresponding to an edge of the sealed space 6 on a right side of a paper surface of FIG. 5) is equal to a shortest distance between the fourth mesa gauge 18 and the sealing portion 20 of the semiconductor substrate 2 (a portion of the sealing portion 20 parallel to the longitudinal direction of the fourth mesa gauge 18, and corresponding to an edge of the sealed space 6 on a left side of the paper surface of FIG. 5). Further, in the <100> direction of the semiconductor substrate 2, a shortest distance between the first mesa gauge 12 and the sealing portion 20 of the semiconductor substrate 2 (a portion of the sealing portion 20 parallel to the longitudinal direction of the first mesa gauge 12, and corresponding to an edge of the sealed space 6 on the left side of a paper surface of FIG. 5) is equal to a shortest distance between the fourth mesa gauge 18 and the sealing portion 20 of the semiconductor substrate 2 (a portion of the sealing portion 20 parallel to the longitudinal direction of the fourth mesa gauge 18, and corresponding to an edge of the sealed space 6 on the right side of the paper surface of FIG. 5). In other words, the positional relationship of the first mesa gauge 12 to the sealing portion 20 and the positional relationship of the fourth mesa gauge 18 to the sealing portion 20 are equal to each other in the <100> direction of the semiconductor substrate 2.

As a result, since the force transmitted to each of the first mesa gauge 12 and the fourth mesa gauge 18 becomes equal to the force applied to the force transmission block 4, the linearity of the output to the force applied to the force transmission block 4 is improved. In addition, the first mesa gauge 12 and the fourth mesa gauge 18 are disposed symmetrically with respect to the center point 6a of the sealed space 6. For that reason, since the force to be applied to the force transmission block 4 is equally transmitted to each of the top faces of the first mesa gauge 12 and the fourth mesa gauge 18, the linearity of the output to the force applied to the force transmission block 4 is further improved.

Figure 6:
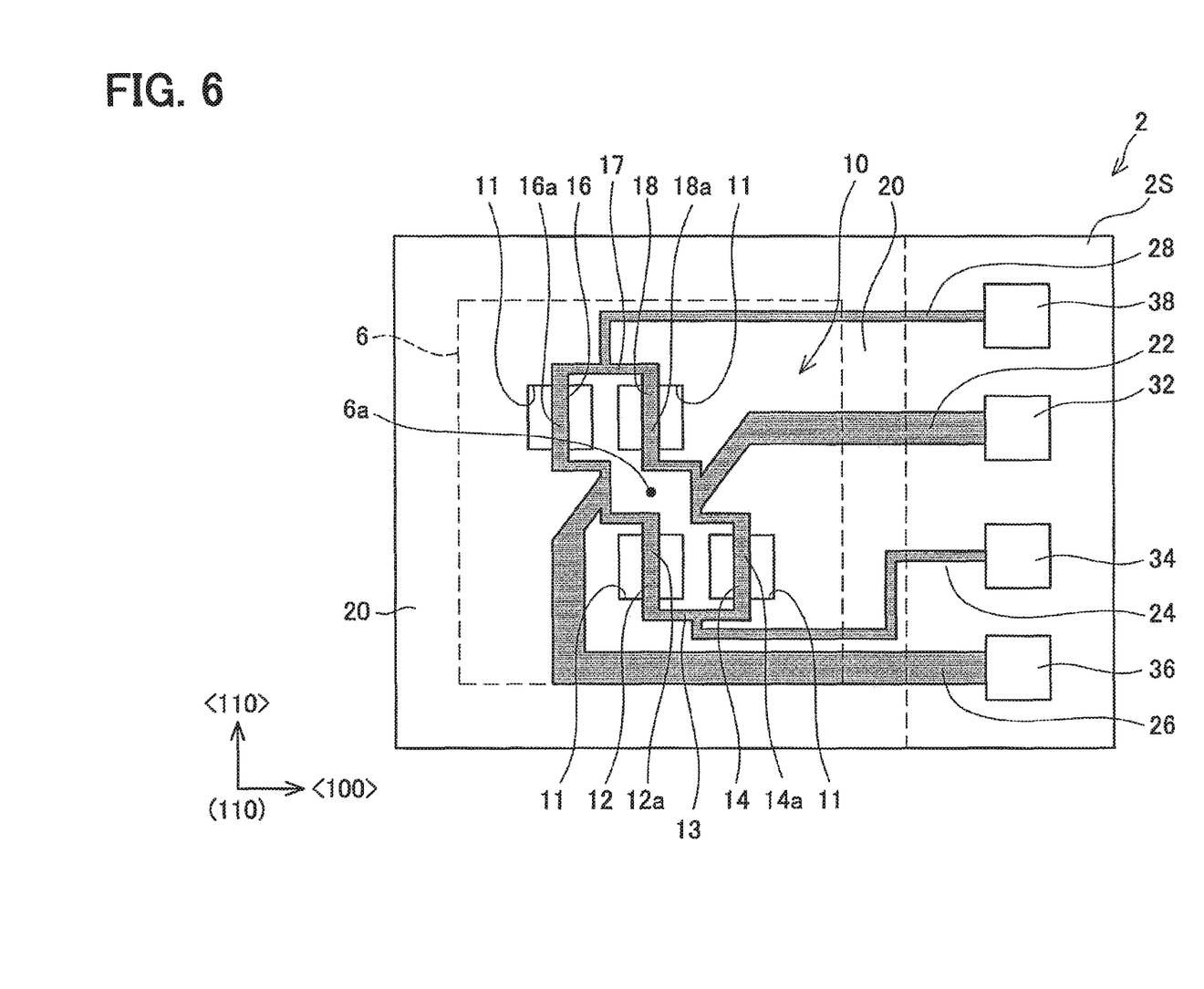

In an example illustrated in FIG. 6, the first mesa gauge 12 and the fourth mesa gauge 18 are disposed side by side in the <110> direction of the semiconductor substrate 2 across a center point 6a of the sealed space 6. The force transmission block 4 is selectively joined to any top surface of the first mesa gauge 12 and the fourth mesa gauge 18, and is not joined to top faces of the second mesa gauge 14 and the third mesa gauge 16.

In addition, both of the first mesa gauge 12 and the fourth mesa gauge 18 are disposed in a positional relationship in which the sealed space 6 is equally divided in two pieces in the <100> direction of the semiconductor substrate 2. In other words, the positional relationship of the first mesa gauge 12 to the sealing portion 20 and the positional relationship of the fourth mesa gauge 18 to the sealing portion 20 are equal to each other in the <100> direction of the semiconductor substrate 2.

As a result, since the force transmitted to each of the first mesa gauge 12 and the fourth mesa gauge 18 becomes equal to the force applied to the force transmission block 4, the linearity of the output to the force applied to the force transmission block 4 is improved. In addition, the first mesa gauge 12 and the fourth mesa gauge 18 are disposed symmetrically with respect to the center point 6a of the sealed space 6. For that reason, since the force to be applied to the force transmission block 4 is equally transmitted to each of the top faces of the first mesa gauge 12 and the fourth mesa gauge 18, the linearity of the output to the force applied to the force transmission block 4 is further improved.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A force detection device comprising:
a substrate that includes a power supply wire, a reference wire, a first output wire, a second output wire and a plurality of mesa gauges disposed on a main surface of the substrate; and
a force transmission block that is connected to the substrate, wherein:
the plurality of mesa gauges include a first mesa gauge, a second mesa gauge, a third mesa gauge, and a fourth mesa gauge;
the first mesa gauge and the second mesa gauge are connected in series with each other between the power supply wire and the reference wire, the first mesa gauge is connected to a power supply wire side, and the second mesa gauge is connected to a reference wire side;
the third mesa gauge and the fourth mesa gauge are connected in series with each other between the power wire and the reference wire, the third mesa gauge is connected to the power supply wire side, and the fourth mesa gauge is connected to the reference wire side;
a pair of the first mesa gauge and the second mesa gauge and a pair of the third mesa gauge and the fourth mesa gauge are connected in parallel to each other between the power supply wire and the reference wire;
the first output wire is connected between the first mesa gauge and the second mesa gauge;
the second output wire is connected between the third mesa gauge and the fourth mesa gauge;
each of the first mesa gauge, the second mesa gauge, the third mesa gauge, and the fourth mesa gauge extends along a first direction; and
a contact area of the force transmission block with respect to a first pair of the first mesa gauge and the fourth mesa gauge is different from a contact area of the force transmission block with respect to a second pair of the second mesa gauge and the third mesa gauge.

2. The force detection device according to claim 1, wherein:
the force transmission block contacts with only one of the first pair and the second pair, and does not contact with the other pair.

3. The force detection device according to claim 1, wherein:
the substrate further includes a sealing portion that surrounds a detection unit where the plurality of mesa gauges are disposed, and is connected to the force transmission block;
the contact area of the force transmission block with respect to one of the first pair and the second pair is larger than the other of the first pair and the second pair; and
a positional relationship between one of the mesa gauges included in the one of the first pair and the second pair and the sealing portion in a second direction orthogonal to the first direction is identical with a positional relationship between another one of the mesa gauges included in the one of the first pair and the second pair and the sealing portion in the second direction orthogonal to the first direction.

4. The force detection device according to claim 3, wherein:
the mesa gauges included in the one of the first pair and the second pair are disposed side by side in the second direction across a center point of a region surrounded by the sealing portion.

5. The force detection device according to claim 3, wherein:
   the first mesa gauge, the second mesa gauge, the third mesa gauge, and the fourth mesa gauge are disposed so as to correspond to rectangular corners, respectively;
   the first mesa gauge and the fourth mesa gauge are disposed diagonally, and the second mesa gauge and the third mesa gauge are arranged diagonally.

6. The force detection device according to claim 3, wherein:
   the mesa gauges included in the one of the first pair and the second pair are disposed side by side in the first direction across a center point of a region surrounded by the sealing portion.

* * * * *